United States Patent
Kuisma

(10) Patent No.: US 9,184,131 B2
(45) Date of Patent: Nov. 10, 2015

(54) METHOD OF MAKING A SYSTEM-IN-PACKAGE DEVICE

(75) Inventor: Heikki Kuisma, Helsinki (FI)

(73) Assignee: MURATA ELECTRONICS OY, Vantaa (FI)

( * ) Notice: Subject to any disclaimer, the term of this patent is extended or adjusted under 35 U.S.C. 154(b) by 0 days.

(21) Appl. No.: 14/127,580

(22) PCT Filed: Jun. 29, 2012

(86) PCT No.: PCT/FI2012/050693
§ 371 (c)(1),
(2), (4) Date: Apr. 1, 2014

(87) PCT Pub. No.: WO2013/001171
PCT Pub. Date: Jan. 3, 2013

(65) Prior Publication Data
US 2014/0217615 A1    Aug. 7, 2014

(30) Foreign Application Priority Data

Jun. 30, 2011  (FI) .................................... 20115682
May 31, 2012  (FI) .................................... 20125595

(51) Int. Cl.
*H01L 23/00*  (2006.01)
*H01L 23/528*  (2006.01)
(Continued)

(52) U.S. Cl.
CPC .......... *H01L 23/528* (2013.01); *B81C 1/00333* (2013.01); *G01C 19/5783* (2013.01);
(Continued)

(58) Field of Classification Search
CPC ....... H01L 23/528; H01L 24/83; H01L 24/96; H01L 24/97; H01L 25/16; H01L 25/18

USPC .......................... 257/686, 777; 438/113, 455
See application file for complete search history.

(56) References Cited

U.S. PATENT DOCUMENTS 6,405,592 B1    6/2002    Murari et al.
2003/0068852 A1    4/2003    Towle et al.
(Continued)

FOREIGN PATENT DOCUMENTS

EP            1951609       8/2008
WO    WO 2007/060290 A1    5/2007
WO        2010057808 A1    5/2010

OTHER PUBLICATIONS

International Search Report dated Nov. 6, 2012 corresponding to International Patent Application No. PCT/FI2012/050693.
(Continued)

*Primary Examiner* — Nathan Ha
(74) *Attorney, Agent, or Firm* — Squire Patton Boggs (US) LLP

(57) ABSTRACT

A method of making a system-in-package device, and a system-in-package device is disclosed. In the method, at least one first species die with predetermined dimensions, at least one second species die with predetermined dimensions, and at least one further component of the system-in-device is included in the system-in package device. At least one of the first and second species dies is selected for redimensioning, and material is added to at least one side of the selected die such that the added material and the selected die form a redimensioned die structure. A connecting layer is formed on the redimensioned die structure. The redimensioned die structure is dimensioned to allow mounting of the non-selected die and the at least one further component into contact with the redimensioned die structure via the connecting layer.

9 Claims, 8 Drawing Sheets

(51) Int. Cl.
*H01L 25/16* (2006.01)
*H01L 25/18* (2006.01)
*B81C 1/00* (2006.01)
*G01P 1/02* (2006.01)
*H01L 23/538* (2006.01)
*G01L 19/14* (2006.01)
*G01P 15/08* (2006.01)
*G01C 19/5783* (2012.01)
*H01L 25/00* (2006.01)
*H01L 21/56* (2006.01)
*H01L 27/146* (2006.01)
*G01L 19/00* (2006.01)

(52) U.S. Cl.
CPC ............... *G01L19/148* (2013.01); *G01P 1/023* (2013.01); *G01P 1/026* (2013.01); *G01P 15/0802* (2013.01); *H01L 23/5389* (2013.01); *H01L 24/17* (2013.01); *H01L 24/19* (2013.01); *H01L 24/83* (2013.01); *H01L 24/96* (2013.01); *H01L 24/97* (2013.01); *H01L 25/16* (2013.01); *H01L 25/18* (2013.01); *G01L 19/0084* (2013.01); *H01L 21/568* (2013.01); *H01L 24/16* (2013.01); *H01L 24/32* (2013.01); *H01L 24/73* (2013.01); *H01L 24/92* (2013.01); *H01L 25/50* (2013.01); *H01L 27/14618* (2013.01); *H01L 2224/12105* (2013.01); *H01L 2224/16145* (2013.01); *H01L 2224/1703* (2013.01); *H01L 2224/32145* (2013.01); *H01L 2224/73204* (2013.01); *H01L 2224/8312* (2013.01); *H01L 2224/8319* (2013.01); *H01L 2224/92125* (2013.01); *H01L 2224/97* (2013.01); *H01L 2924/14* (2013.01); *H01L 2924/1433* (2013.01); *H01L 2924/1461* (2013.01); *H01L 2924/15311* (2013.01); *H01L 2924/18162* (2013.01)

(56) References Cited

U.S. PATENT DOCUMENTS

| | | | | |
|---|---|---|---|---|
| 2004/0178488 | A1 | 9/2004 | Bolken et al. | |
| 2006/0214278 | A1* | 9/2006 | Martin | 257/686 |
| 2006/0226527 | A1* | 10/2006 | Hatano et al. | 257/686 |
| 2007/0114623 | A1* | 5/2007 | Kuisma | 257/415 |
| 2007/0132047 | A1* | 6/2007 | Kuisma et al. | 257/415 |
| 2008/0136009 | A1 | 6/2008 | Theuss et al. | |
| 2008/0197469 | A1* | 8/2008 | Yang et al. | 257/686 |
| 2008/0258286 | A1* | 10/2008 | Gerber et al. | 257/686 |
| 2009/0051024 | A1* | 2/2009 | Chia | 257/686 |
| 2009/0127686 | A1* | 5/2009 | Yang et al. | 257/686 |
| 2010/0001396 | A1 | 1/2010 | Meyer et al. | |
| 2010/0090335 | A1* | 4/2010 | Chung | 257/712 |
| 2011/0031634 | A1 | 2/2011 | Pagaila | |
| 2012/0049353 | A1 | 3/2012 | Osenbach | |

OTHER PUBLICATIONS

Kenneth M. Brown, System In Package, "The Rebirth of SIP," In: Proceedings of the IEEE Custom Integrated Circuits Conference. IEEE, 2004, p. 681-686.

Supplementary Partial European Search Report dated Mar. 23, 2015, issued in corresponding EP Patent Application No. 12 80 5018.

Supplementary European Search Report dated Aug. 17, 2015 corresponding to European Patent Application No. 12805018.

\* cited by examiner

US 9,184,131 B2

METHOD OF MAKING A SYSTEM-IN-PACKAGE DEVICE

FIELD OF THE INVENTION

The invention belongs to the field of microelectronics and more specifically to a method of making a system-in-package device, and a system-in-package device including at least one first species die with predetermined dimensions, at least one second species die with predetermined dimensions, and at least one further component of the system-in-device.

BACKGROUND

Restricted space and the ever increasing degree of circuit integration have set demands in the manufacturing of electronics in many ways, in various fields of component making. Surface mounted components have been decreasing in their size, thus facilitating large amounts of them to be integrated on to a printed wiring board. Similar physical size decreasing trend has been also going on in the field of microelectromechanical systems (MEMS). The evolution of the design has led to integration in very high level and finally to stacked structures, when the demand of mounting space has increased even faster than the component size decrease as such.

A patent publication EP1951609 describes a system-in-package device where a MEMS-die and an integrated circuit (IC) die are stacked on top of each other. FIG. 1 illustrates a system-in-package device applying this known configuration where external electrical contacts are provided on the surface of the bigger of the two dies. This kind of system-in-package device is applicable when one of the dies is significantly smaller than the other die, thus leaving room for contact areas on the surface of the bigger die. To be practically applicable, the smaller die has also to be quite thin, below 0.2 mm.

Another example of prior art is given in patent publication U.S. Pat. No. 6,405,592B1. Also there only certain size ratios of the two dies are allowed.

For commercially feasible applications, dies to be included in system-in-package devices come from various sources and their dimensions are already predetermined at the time of their use for system-in-package device production. As long as the system-in-package device configuration is simple and the dies to be packaged appropriately match in size such that any necessary components or wiring, like external electrical connections, can be provided on the larger die, the solution of EP1951609 is applicable. However, when the dies are quite close in size, the conventional method cannot be used since there is no room for other necessary elements, like contacting members that provide necessary input/output functions of the system-in-package device. Due to this mismatch problem, many functionally advantageous and desired system-in-package configurations have not yet become commercially available.

SUMMARY

An object of the present invention is thus to provide an improved method for producing system-in-package devices, and system-in-package devices produced with the method. The objects of the invention is achieved by a method and a system-in-package device, which are characterized by what is stated in the respective independent claim. The preferred embodiments of the invention are disclosed in the dependent claims.

Embodiments of the invention comprise a method of making a system-in-package device, the method comprising including in the system-in package device at least one first species die with predetermined dimensions, at least one second species die with predetermined dimensions, and at least one further component of the system-in-device; selecting at least one of the first and second species dies for redimensioning; adding material to at least one side of the selected die such that the added material and the selected die form a redimensioned die structure; forming a connecting layer on the redimensioned die structure; and dimensioning the redimensioned die structure to allow mounting of the non-selected die and the at least one further component into contact with the redimensioned die structure via the connecting layer.

In an aspect, the method further comprises: manufacturing on to a native first wafer a first plurality of first species dies with a first allotment of the first species dies on said native first wafer, the predetermined dimensions of the one first species die being determined by the first allotment; and manufacturing on to a native second wafer a second plurality of second species dies with a second allotment of the second species dies on said native second wafer, the predetermined dimensions of the one second species die being determined by the second allotment.

In an aspect, the at least one further component of the system-in-device is a connection member for input and output operations of the system-in-package device.

In an aspect, the method further comprises including two or more dies into the redimensioned die structure.

In an aspect, the method further comprises mounting two or more dies into contact with the redimensioned die structure via the connecting layer.

In an aspect, the method further comprises including in the redimensioned die structure of the system-in package device a die that includes a passage for fluids In an aspect, the method further comprises including in the redimensioned die structure of the system-in package device a die that includes at least one of the following elements: an optical element, a movement sensor, a pressure sensor a timing device, a filter device, an accelerometer, a magnetometer, a micro pump, and a microphone.

In an aspect, the method further comprises connecting the connection member to the connecting layer by means of a through-encapsulant via extending through the redimensioned die structure.

In an aspect, the first species die or the second species die comprises at least one of the following elements: a MEMS device, an integrated semiconductor circuit, an ASIC circuit, oscillator, an optical device, an opto-electrical device, a magnetic device, a transducer, a sensor, a filter, switching board, wiring board, magnetostrictive element, electrostrictive element, piezoelectric device.

Embodiments of the invention comprise also a system-in-package device, comprising at least one first species die; at least one second species die; at least one further system-in-device component; at least one of the first and second species dies being included in a redimensioned die structure formed by solid material added to at least one side of the die; a connecting layer on the redimensioned die structure; and a non-selected die and the at least one further component mounted in contact with the redimensioned die structure via the connecting layer.

In an aspect, dimensions of the first species die are determined by a first allotment of dies in a native first wafer; and dimensions of the second species die are determined by a second allotment of dies in a native second wafer.

In an aspect, at least one further component of the system-in-device is a connection member for input and output operations of the system-in-package device.

In an aspect, the redimensioned die structure includes two or more dies.

In an aspect, two or more dies are in contact with the redimensioned die structure via the connecting layer.

In an aspect, the redimensioned die structure includes a die that provides a passage for fluids In an aspect, the system-in package device includes a die that comprises at least one of the following elements: an optical element, a motion sensor, a pressure sensor a timing device, a filter device, an accelerometer, a magnetometer, a micro pump, and a microphone.

In an aspect, the connection member is connected to the connecting layer by means of a through-encapsulant via that extends through the redimensioned die structure.

In an aspect, the first species die or the second species die of the system-in-package device further comprises at least one of the following elements: a MEMS device, an integrated semiconductor circuit, an ASIC circuit, oscillator, an optical device, an opto-electrical device, a magnetic device, a transducer, a sensor, a filter, switching board, wiring board, magnetostrictive element, electrostrictive element, piezoelectric device.

LIST OF FIGURES

In the following, embodiments will be described in greater detail with reference to accompanying drawings, in which FIG. 1 illustrates a prior art system-in-package device configuration;

DETAILED DESCRIPTION OF SOME EMBODIMENTS

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with simple examples of device configurations with which various embodiments of the invention may be implemented. Only elements relevant for illustrating the embodiments are described in detail. Various implementations of methods and devices may comprise elements that are generally known to a person skilled in the art and may not be specifically described herein.

Figure 1:
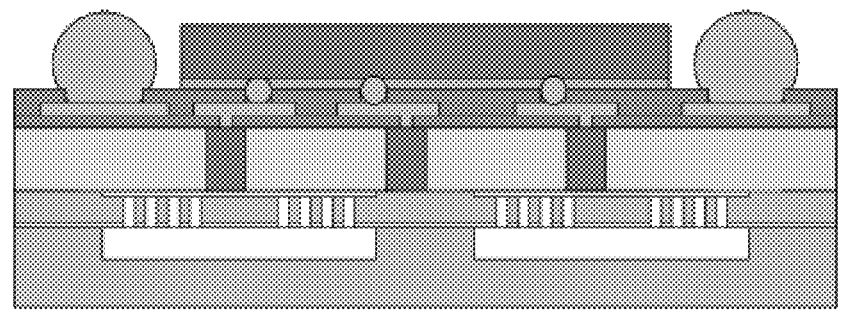
Figure 2:
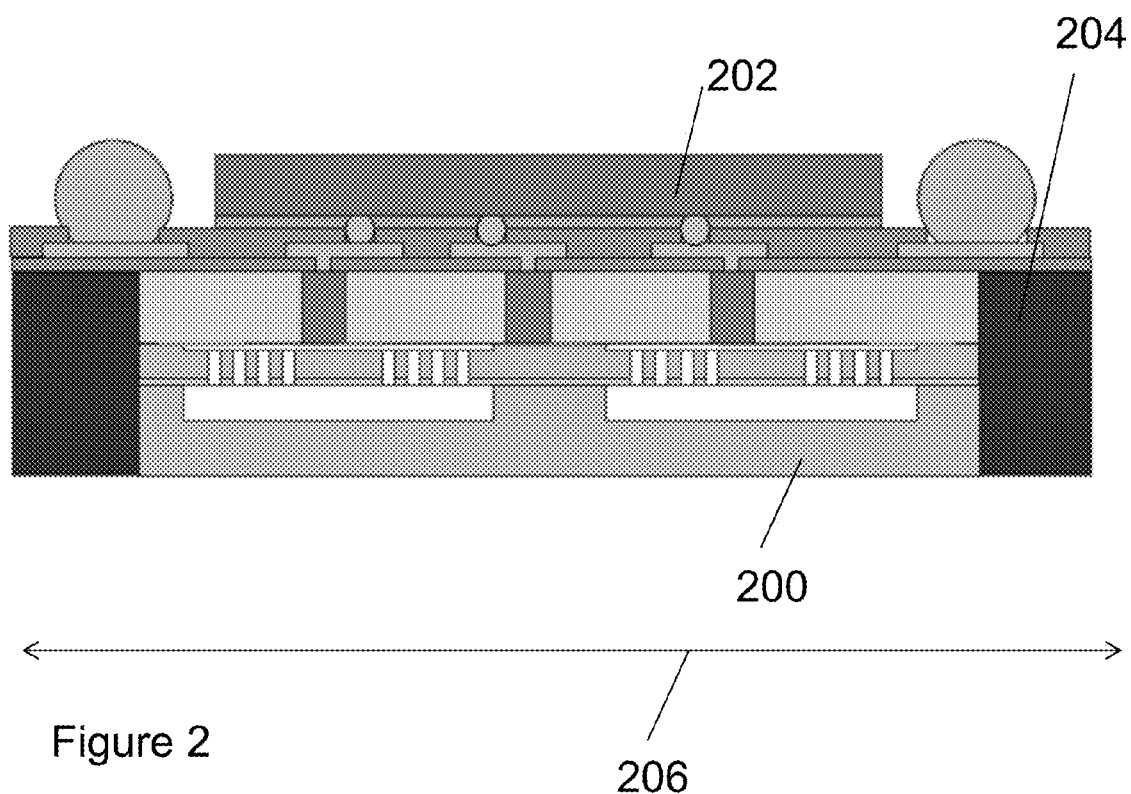
FIG. 2 illustrates a system-in-package device according to an embodiment of the invention.

FIG. 2 illustrates basic configuration of a system-in-package device, produced with a method according to an embodiment of the invention. In FIG. 2, a MEMS-die is used to represent a first species die 200 with predetermined dimensions, and an IC-die is used to represent a second species die 202 with predetermined dimensions. The species of a die means here that the die is designed and dimensioned to specific functions separate from the system-in-package device production process. Due to this, the first species dies and second species dies do not necessarily match in size for packaging into a system-in-package device. The sizes of dies are typically decided by allotments in their respective native wafers. As may be understood from FIG. 2, the original size difference between the first and second species dies 200, 202 may be so small that after stacking there is not enough room for any other components necessary for functions of the system-in-package device. Conventionally this would mean that the combination of dies could not be included in a system-in-package device, even if their functions as such would be compatible, and their combination from the production cost point of view would be highly desirable.

In embodiments of the invention, to overcome this problem, the production process of the system-in-package device has been complemented with a stage where the size difference between the first species die and the second species die is adjusted by fixedly adding low-cost material 204 to at least one side of at least one of the dies. Typically the low-cost material is molded plastic material that at least partly embeds the die selected for size adjustment. The low-cost material, together with the selected die form a redimensioned die structure 206 on which the other die and any necessary components and wiring required for operation of the system-in-package device may be constructed. FIG. 2 shows an example in which the MEMS die 200 is selected for size adjustment, but the scope is naturally not limited to extension of any particular die species.

FIGS. 3 to 10 illustrate steps in an embodiment of a method of making a system-in-package device. In the exemplary embodiment the redimensioned die structure is formed with process steps adopted from fan-out wafer-level packaging technology (FO-WLP). The FO-WLP is a specific packaging technology that is developed and used to increase fan-out of individual IC-dies. The inventors have discovered that part of the FO-WLP process steps may be adopted into a system-in-package device production process to overcome in an economical way a completely other type of mismatch problem between dies of the system-in-package device. It is noted, however, that the scope is not limited to use of FO-WLP, other methods for fixing low-cost material to at least one side of at least one of the dies may be applied without deviating from the scope of protection.

Figure 3:
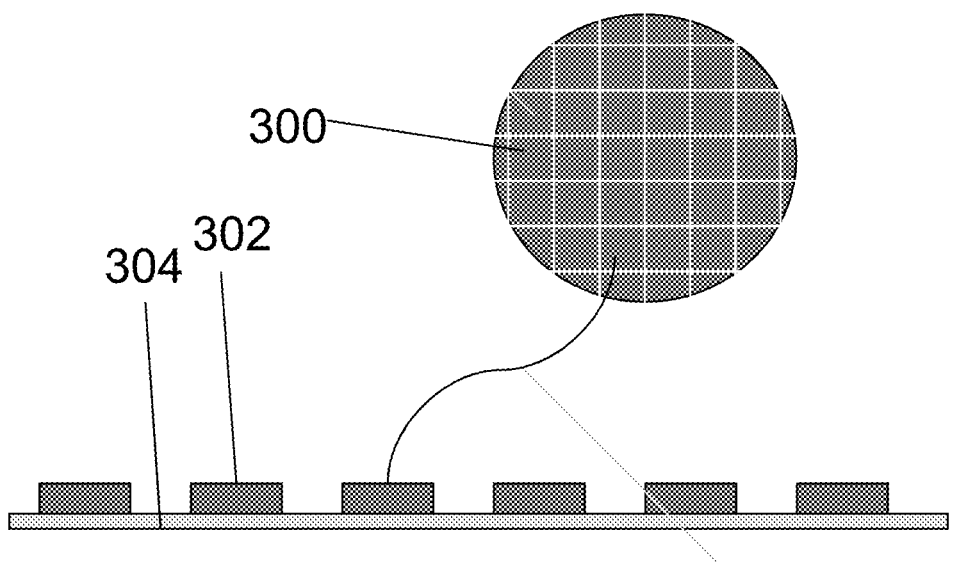
FIGS. 3 to 10 illustrate steps of en embodiment of a method for making a system-in-package device.
Figure 4:
Figure 5:

In the beginning, redimensioned die structures are produced. For this, a first wafer 300 may be diced according a specific allotment into dies with a predefined dimension. In the exemplary embodiment, the first species dies originate from a first type wafer, here an IC-wafer. These first species dies 302 may be picked and placed on a tape 304 so that their electrical contact areas are against the tape (FIG. 3). The distance between the first species dies on the tape is adjusted to provide the new dimensions of the redimensioned die structure, and the new dimensions are adjusted according to the system-in-package device design. More specifically, the new dimensions are adjusted according to dimensions of elements in at least one other die layer of the system-in-package device. The term die layer refers here to a layer in the system-in-package device configuration that includes at least one die. A surface of the first species die that is against the tape will be part of the surface of the redimensioned die, and provides electrical contact areas for connection with the second species die. After this, plastic material 306 may be molded on the dies 302 on the tape 304 to cover the dies and fill spaces between the dies (FIG. 4). A new reconstructed substrate or wafer including a plurality of redimensioned die structures is formed. The tape may be removed whereby the electrical contact areas of the IC-dices are exposed (FIG. 5).

Figure 6:
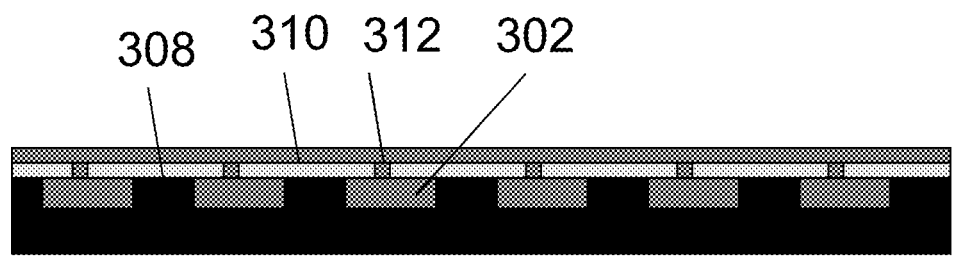
Figure 7:

After this, connecting means for electrically connecting electrical contact areas of the first species dies to subsequent system-in-package layers may be provided in a known manner. For example, the contacting means may be implemented as a redistribution layer that comprises a layer of insulating material 308 and a layer of conductive material 310 deposited and patterned on the surface of the reconstructed wafer from which the tape was removed. In the redistribution layer, openings 312 made to the insulating material may be used to provide an electrical connection between the conductive material 310 and the IC-die 302 (FIG. 6). The plastic material may be thinned on the opposite side of the reconstructed wafer (FIG. 7). The thinning operation may extend so far that the back sides of the dies are exposed.

Figure 8:
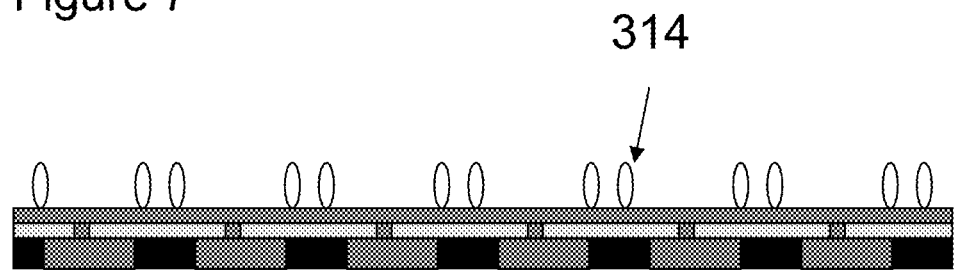
Figure 9:
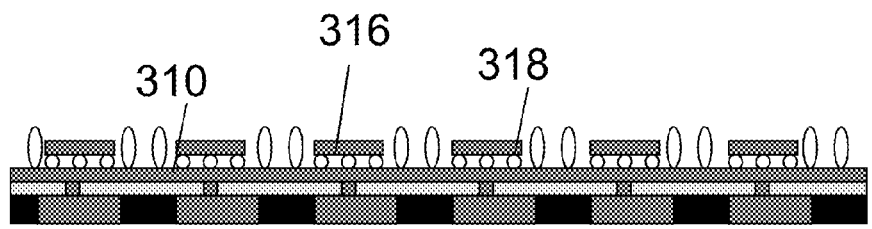
Figure 10:
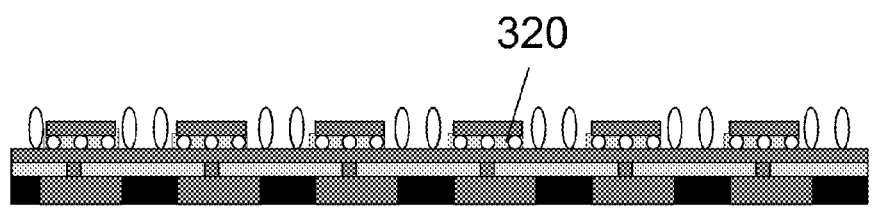

In this example, a die layer comprising the second species die is the die layer based on which the new size of the redimensioned die structure is adjusted. Creation of the die layer may begin here with deposition of system-in-device contact members, here under bump metallization and solder bumps 314 on the conducting material 310 (FIG. 8). After this, the second species dies 316 to be included in the same system-in-package device may be mounted. Let us assume that the second species dies 316 originate from a second wafer, which is independently designed and whose dimensions and allotments therefore are not specifically adjusted for the purpose of forming a specific system-of-package device. The dimensions of the second species dies are thus predetermined by the dimensions and allotments of the originating second wafer. The second species dies may be IC-dies or MEMS-dies, and they may comprise electrical connectors 318, such as flip-chip bumps. The second species dies 316 may be assembled face down on the reconstructed wafer so that the redimensioned die structures and the second species dies become electrically connected via the electrical connectors 318 and the conducting material 310. Due to the adjusted new dimensions, the second species dies and the contact members optimally match with the redimensioned die structures and functional packaged devices are formed. An underfill-material 320 (FIG. 10) may be applied to the space between the second species die 316 and the reconstructed wafer. Finally the reconstructed wafer may be diced to form a multitude of system-in-package devices, similar to the one shown in FIG. 2.

By means of the proposed method, a system-in-package device with two or more dies may be efficiently and economically produced from die species of separately predefined dimensions. This significantly increases versatility in design of system-in-package devices; a broader range of dies may be combined into a system-in-package device while the size-mismatch of dies in different die layers does not limit implementation of possible configurations. The versatility in design enables a wide range of economically viable new system configurations. The increased versatility is achieved in a simple manner and without essentially increasing production costs. It has been detected that system-in-package devices with high die area ratios (e.g. 0.5 to 2 for the IC/MEMS structures) may be achieved. In this range, high volume die supply chains become available.

Figure 11:
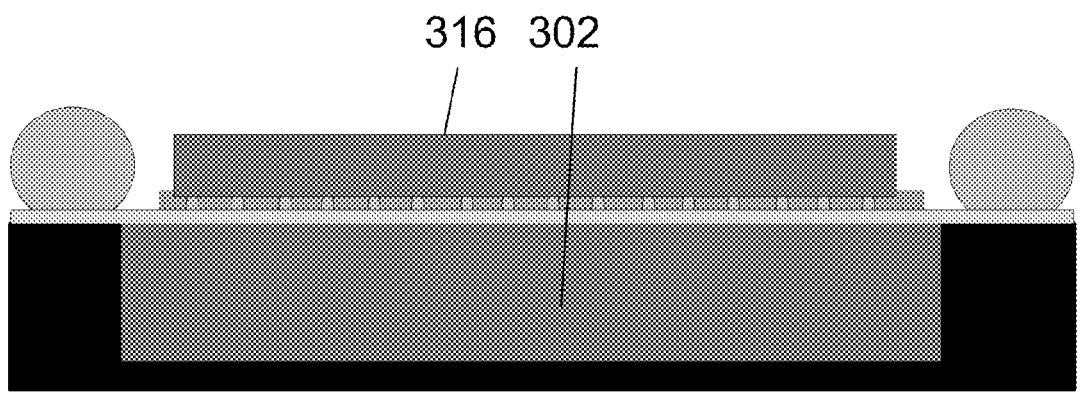
FIG. 11 illustrates a new configuration achievable with the proposed new method.
Figure 12:
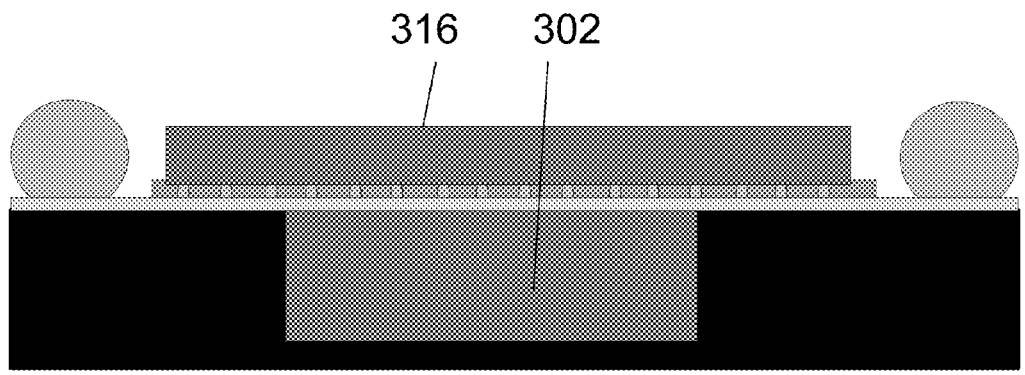
FIG. 12 illustrates another new configuration achievable with the proposed new method.

FIGS. 11 and 12 illustrate advantageous system-in-package configurations achieved with the proposed new method. The reference numbers in FIGS. 11 and 12 correspond to the same elements than in FIGS. 3 to 10. In the configuration of FIG. 11 a die 316 of one species with a predefined size has been be packaged into a system with a slightly bigger die 302 of the other species, and in the configuration of FIG. 12 the same die 316 has been be packaged into a system with a smaller die 302 of the other species. Due to the possibility to freely select a die for a redimensioned die structure, and adjust the size difference between the dies to be packaged, only functional and economical applicability of a die to a specific die layer needs to be considered in design, appropriate dimensional match between the dies may be achieved in production with the method described above.

Furthermore, the proposed solution provides a way to improve yield of produced good-quality system-of-package devices. The method provides a stage (FIG. 3) where the first species dies are placed on the tape. Before this stage, the first species dies may be pre-tested. By including to the subsequent processes only successfully pre-tested first species dies, only known good dies end up being included in the reconstructed wafer. For example, the MEMS dies 32 that are placed on the tape in FIG. 4 may be pre-tested and only known good MEMS-dies may be picked.

Figure 13:
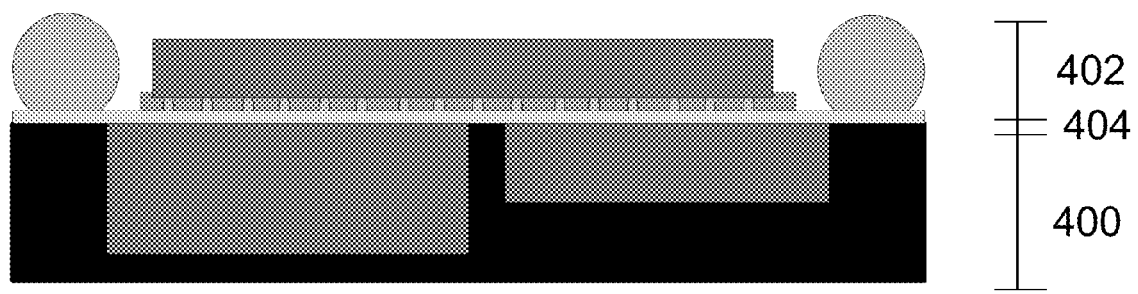
FIG. 13 illustrates a further embodiment where an extended die layer comprises two dies.
Figure 14:
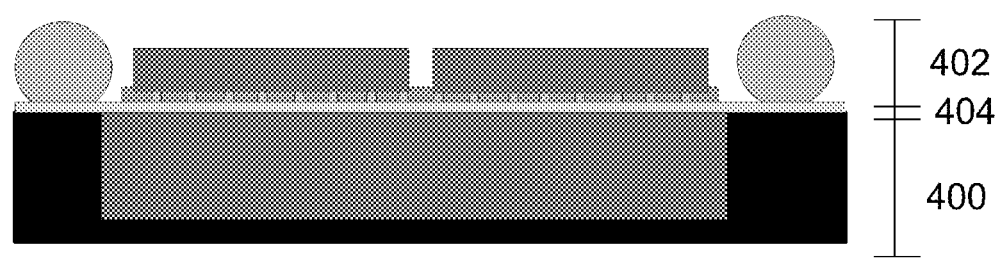
FIG. 14 illustrates a further embodiment with the connected die layer comprises two dies.

The added versatility does not only allow one to freely select dies of different sizes to successive die layers of a system-in-package device. The proposed method also makes it possible to include two or more dies in parallel in a layer of the system-in-package device. This is illustrated in FIGS. 13 and 14. FIGS. 13 and 14 show a system-in-package device comprising a first die layer 400, and a second die layer 402, connected via a redistribution layer 404. In the example of FIG. 13, the first die layer comprises two dies and the second die layer one dies. For appropriate size adjustment between the dies of the first die layer 400 and the die of the second die layer, the dies of the first die layer 400 have been at least partly encased into a plastic molding to form a redimensioned die structure. The new dimensions of the structure are adjusted so that the die of the second die layer 402 and any necessary wiring of the system-in-package device may be constructed. For this, the dies of the first die layer 400 may be placed on the tape such that the reconstructed wafer contains the two dies for each system-in-package device. For a person skilled in the art it is clear that a reconstructed wafer may contain also more than two dies adjusted by means of plastic molding to be included in parallel into individual system-in-package devices.

In FIG. 14, the first die layer comprises two dies and the second die layer one die. This configuration may be achieved by mounting two or more second species dies for one system-in-package devices face down on the reconstructed wafer.

It is noted that with conventional methods the size mismatch issue for such multiple-die die layer configurations is very severe, only very limited number of functional components of predefined size have been combined into system-in-package devices. By means of the proposed method, a wide range of functional configurations can now be designed and produced in an economically viable way.

The proposed method does not only eliminate problems arising from the dies having non-matching surface sizes. The possibility to redimension die layers is valuable also where combination of dies is prevented by too large thickness of the smaller of the dies to be combined. This small but thick die may be placed in the first die layer (the reconstructed wafer) and the larger but thinner die may be placed on the second die layer as shown in FIG. 12. Such problems are common in system-in-package devices where a die comprises integrated functional elements that require space and thereby increase thickness of the die.

Figure 15:
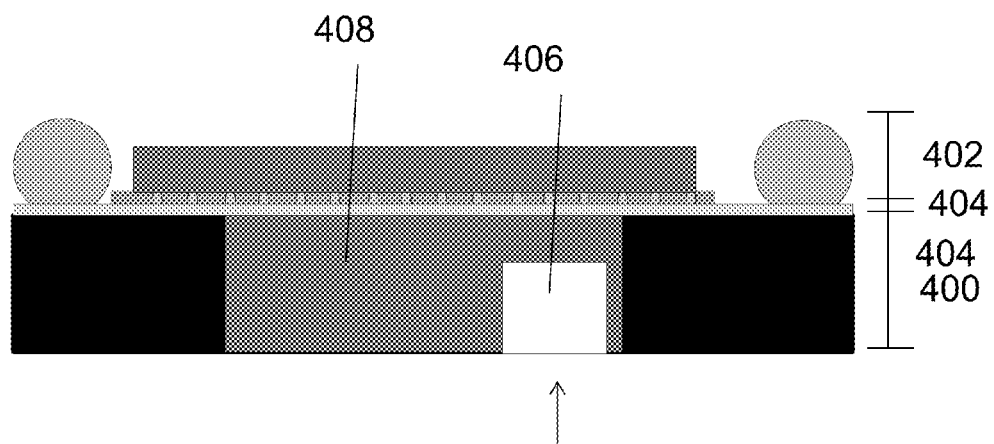
FIG. 15 illustrates a further embodiment where a die comprises a passage for fluids.

FIG. 15 illustrates an exemplary embodiment where die dimensions are configured to include a fluid passage for volatile substances (liquids, gases) to the system-in-package device. Such a passage for fluids is needed in e.g. pressure sensors, microphones, micro pumps and other liquid and gas handling and/or measuring devices. The mismatch problem is very severely met in these system-in-package devices, since the dimensions of many economically viable sensor dies do not appropriately match with the size of the required IC die. For example, an economically feasible pressure sensor die 406 is typically much smaller than a corresponding IC-die, but also relatively thick, often in the range of 0.5 to 1 mm. Due to the difference in surface areas between the dies, the state of the art solution could be applied. However, in such case the relatively thick sensor die should be on top of the larger IC-die, due to which the IO-bump size should be over 0.5 mm, which is not practical. FIG. 15 shows how this problem is avoided when the order of the dies in the system-in-package device configuration may be designed without considering the sized of the included dies.

The system-in-package device of FIG. 15 comprises a first die layer 400 and a second die layer 402, connected via a redistribution layer 404. A passage 406 for liquid or gas entry is opened to the first die layer 400, in this example on the back side of die 408 in the reconstructed wafer. The term back refers here to the side opposite to the side where the electrical contacts are. The passage may be formed prior to the assembly of the dies on the tape to manufacture the reconstructed wafer. In such case the opening has to be protected by a protecting layer of material during the moulding process to prevent the entry of the moulding compound to the opening. The opening 406 can also be manufactured to the die 408 after the molding process. The die 406 may also comprise a plurality of openings. The device of FIG. 15 may alternatively comprise a pressure sensor, a micro pump, a microphone or any other device for handling or measuring a property of a liquid or a gas. The new method opens a practical and economically feasible way to manufacture system-in-package devices that apply fluids input to the system-in-package device.

Figure 16:
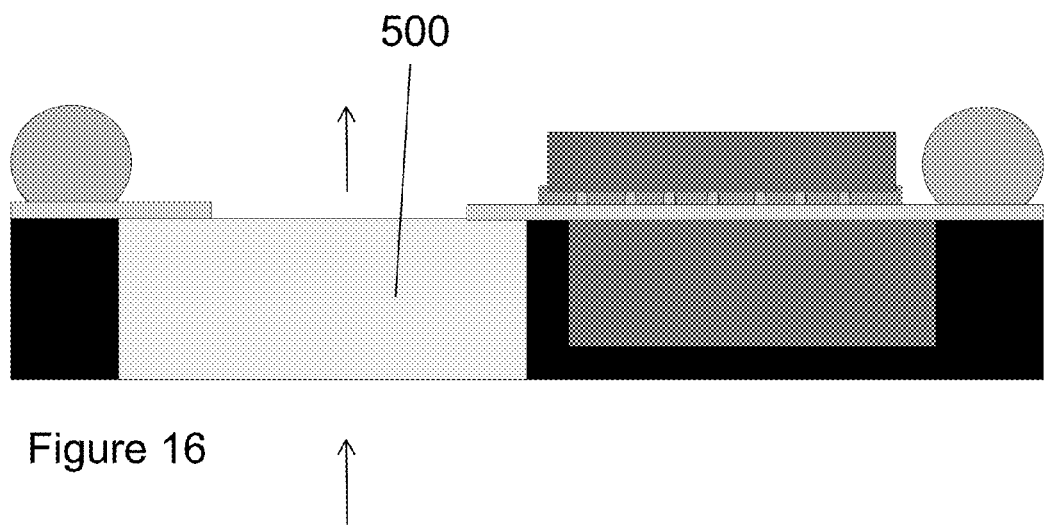
FIG. 16 illustrates a further embodiment where a die comprises an optical element.

FIG. 16 illustrates a further embodiment where system in package comprises an optical element 500 such as a light source, detector, filter, lens, prism, polarizer, grating, window or other similar optical or electro-optical element. In this exemplary embodiment, the optical element is incorporated into the redimensioned die structure. Also the optical element may comprise an opto-electro-mechanical element such as a spectrometer, autofocus lens or beam scanning device, an image stabilizer or a display device. The optical element may have an optical path on the upper or lower surface or both. According to an embodiment the optical element can have electro- and/or magnetostrictive properties that can be used for modifying the optical path. Due to the proposed method, the optimized die combination shown in FIG. 16 can be implemented in an economically viable way. Embodiments of FIG. 16 may be used to provide an autofocus lens system, an optical image stabilizer system, a spectrometer, a display device, a light source or radiation detector, or a suitable combination thereof.

Figure 17:
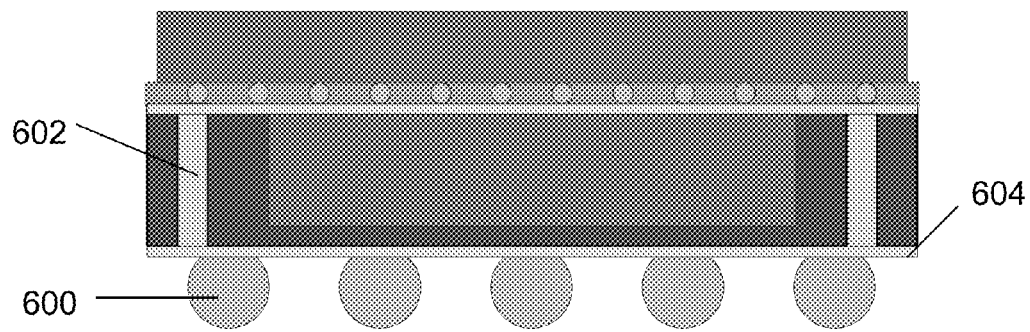
FIG. 17 illustrates a possible configuration of a system-in-package device.
Figure 18:
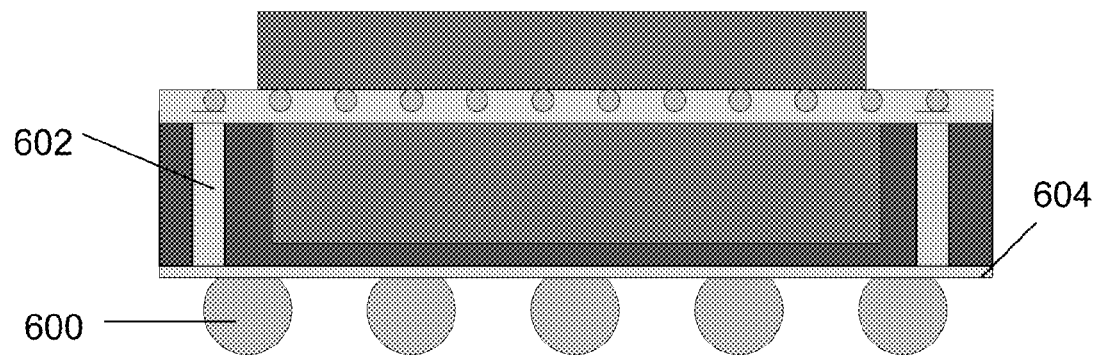
FIG. 18 illustrates a further configuration of a system-in-package device.
Figure 19:
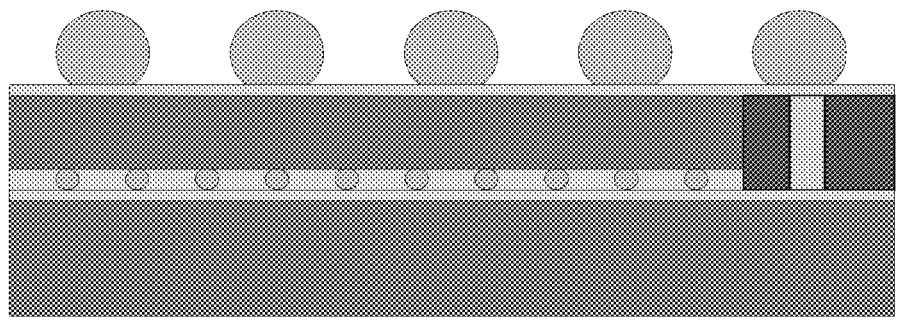
FIG. 19 illustrates a further configuration of a system-in-package device.
Figure 20:
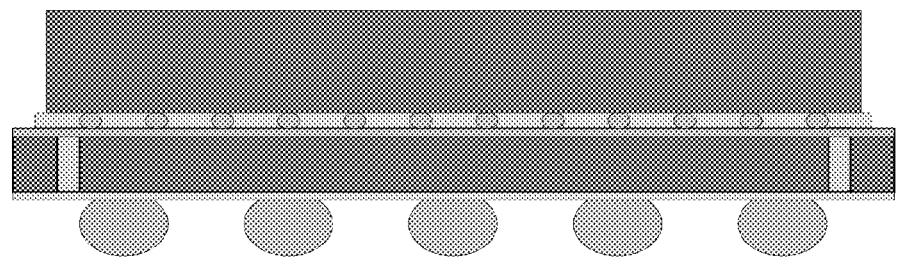
FIG. 20 illustrates a further configuration of a system-in-package device.

Dimensioning of the redimensioned die structure is not only based on adding dimensions of the overlaying die and the other components together. FIGS. 17 and 18 illustrate further possible configurations of system-in-package devices. In these embodiments IO bumps 600 acting as connection members are not directly mounted on the redistribution layer on the redimensioned die structure, but placed below it. The IO bumps are connected to the redistribution layer by means of a through-encapsulant via 602 and a further connection layer 604 in the other side of the redimensioned die structure. The through-encapsulant vias may extend through the redimensioned die structure Die layers described in previous embodiments may also be combined in one system-in-package device so that a combined set of functions is formed. Selection of die species and for die layers depend on the desired application of the system-in-package device, and are familiar to persons skilled in the application fields. The set of function may provide, for example, a combined sensor for acceleration, angular range, earth's magnetic field and atmospheric pressure. These kinds of devices are useful in navigation systems.

An embodiment of the system-in-package device may alternatively provide an inertial sensor such as an accelerometer, an angular rate sensor or a combined sensor that has both functions. The die on the reconstructed wafer may be a MEMS die for such a sensor functions and the die attached face down on the reconstructed wafer may be an IC-die for inertial sensor functions.

An embodiment of the system-in-package device may alternatively provide a timing device for generating a frequency signal or a time signal, a filter device for frequency filtering of an electrical signal, or a tunable capacitor or a switch for use in measuring systems or radio frequency circuits.

An embodiment of the system-in-package device may alternatively provide an inertial sensor die with separate accelerometer, an angular rate sensor die and an interface circuit die. It may also provide a compass with an accelerometer die for tilt compensation, a magnetometer die and a circuit. The device may also provide a many degrees of freedom sensor with an accelerometer, an angular rate sensor, a magnetometer and circuit functions in more than two dies.

A system-in-package device according to an embodiment of the invention may comprise following types of dies: a MEMS device, an integrated semiconductor circuit, an ASIC circuit, oscillator, an optical device, an opto-electrical device, a magnetic device, a transducer, a sensor, a filter, switching board, wiring board, magnetostrictive element, electrostrictive element, piezoelectric device.

The system-in-package can be provided for a functionality that comprises at least one of the following:
a periodic change of the shape of a functional element in a vibration movement,
static change of the shape of a functional element from a first state to a second state of the shape in response to a control signal,
position change of a functional element periodically,
position change of a functional element from a first static state to a second state responsively to a control signal,
transparency and/or opacity of a functional element for electromagnetic radiation in a wavelength range of said electromagnetic radiation,
acting as a radiation source of electromagnetic radiation,
acting as a transducer for a mechanical wave,
acting as a switching layer that can be turned on and/or off
acting as an attenuation layer,
acting as a switching board,
acting as a wiring board.

The system-in-package device configuration described here may be included into a camera, a cellular phone, a PDA, a computer, a portable device, a navigator, an antenna circuit, an oscillator, a resonator, a filter unit, a memory element, a radio device, a laser device, an optical controller, a pointer, a gyroscope, an acceleration sensor, a radar element, a gun, a missile, an airplane, a car, a ship, a motor cycle, a mechanical motor, an electric motor, a jet motor, a rocket motor, a servo sensor, a pneumatic sensor, a pressure sensor, a position sensor, a heating device, a ventilation device, a moisture sensor, scales, a tool, a pump, a building and a robot, an electrostatic device, a magnetic device, a clock, a timer, an elevator, an escalator, a crane, a velocity meter, an angular velocity meter, or an acceleration sensor. The list is not exhaustive but aimed to give a view to a skilled man in the art for the versatility of the stacked and/or redimensioned structures.

It will be obvious to a person skilled in the art that, as the technology advances, the inventive concept can be implemented in various ways. The invention and its embodiments are not limited to the examples described above but may vary within the scope of the claims.

The invention claimed is:

1. A method of making a system-in-package device, the method comprising
    including in the system-in package device at least one first species die with predetermined dimensions, at least one second species die with predetermined dimensions, and at least one further component of the system-in-device;
    selecting at least one of the first and second species dies for redimensioning;
    adding material to at least one side of the selected die(s) such that the added material and the selected die(s) form a redimensioned die structure;
    forming a connecting layer on the redimensioned die structure;
    dimensioning the redimensioned die structure to allow mounting of the non-selected die and the at least one further component into contact with the redimensioned die structure via the connecting layer; and
    thinning the added material of the redimensioned die structure by removing a portion of the added material.

2. The method according to claim 1, wherein the method further comprises:
    manufacturing on to a native first wafer a first plurality of first species dies with a first allotment of the first species dies on said native first wafer, the predetermined dimensions of the one first species die being determined by the first allotment;
    manufacturing on to a native second wafer a second plurality of second species dies with a second allotment of the second species dies on said native second wafer, the predetermined dimensions of the one second species die being determined by the second allotment.

3. The method according to claim 1, wherein the at least one further component of the system-in-device is a connection member for input and output operations of the system-in-package device.

4. The method according to claim 1, wherein the method comprises including two or more dies into the redimensioned die structure.

5. The method according to claim 1, wherein the method comprises mounting two or more dies into contact with the redimensioned die structure via the connecting layer.

6. The method according to claim 1, wherein the method comprises including in the redimensioned die structure of the system-in package device a die that includes a passage for fluids.

7. The method according to claim 1, wherein the method comprises including in the redimensioned die structure of the system-in package device a die that includes at least one of the following elements: an optical element, a motion sensor, a pressure sensor a timing device, a filter device, an accelerometer, a magnetometer, a micro pump, and a microphone.

8. The method according to claim 3, wherein the method comprises connecting the connection member to the connecting layer by means of a through-encapsulant via extending through the redimensioned die structure.

9. The method according to claim 1, wherein the first species die or the second species die comprises at least one of the following elements: a MEMS device, an integrated semiconductor circuit, an ASIC circuit, oscillator, an optical device, an opto-electrical device, a magnetic device, a transducer, a sensor, a filter, switching board, wiring board, magnetostrictive element, electrostrictive element, piezoelectric device.

* * * * *